United States Patent
Tsutae

(10) Patent No.: US 7,419,919 B2
(45) Date of Patent: Sep. 2, 2008

(54) METHOD OF MANUFACTURING SEMICONDUCTOR DEVICE

(75) Inventor: Hiroomi Tsutae, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 468 days.

(21) Appl. No.: 11/221,832

(22) Filed: Sep. 9, 2005

(65) Prior Publication Data

US 2006/0009045 A1    Jan. 12, 2006

Related U.S. Application Data

(62) Division of application No. 10/246,675, filed on Sep. 19, 2002, now Pat. No. 6,998,340.

(30) Foreign Application Priority Data

May 17, 2002    (JP) ............................. 2002-142683

(51) Int. Cl.
*H01L 21/00* (2006.01)

(52) U.S. Cl. .................... 438/778; 438/624; 438/783; 438/784

(58) Field of Classification Search ................ 438/624, 438/778, 783–784
See application file for complete search history.

(56) References Cited

U.S. PATENT DOCUMENTS

| | | | | |
|---|---|---|---|---|
| 4,410,558 A | * | 10/1983 | Izu et al. ........................ | 438/62 |
| 4,519,339 A | * | 5/1985 | Izu et al. ...................... | 118/718 |
| 5,937,323 A |   | 8/1999 | Orczyk et al. | |
| 6,100,466 A | * | 8/2000 | Nishimoto ................... | 136/258 |
| 6,121,162 A | * | 9/2000 | Endo ........................... | 438/787 |
| 6,136,685 A |   | 10/2000 | Narwankar et al. | |
| 6,217,658 B1 |   | 4/2001 | Orczyk et al. | |
| 6,254,792 B1 | * | 7/2001 | Van Buskirk et al. ......... | 216/13 |
| 6,372,291 B1 |   | 4/2002 | Hua et al. | |
| 6,413,871 B2 |   | 7/2002 | M'Saad et al. | |
| 6,488,995 B1 | * | 12/2002 | Nishimoto et al. ........... | 427/574 |
| 6,511,923 B1 |   | 1/2003 | Wang et al. | |
| 6,709,610 B2 | * | 3/2004 | Van Buskirk et al. ......... | 216/64 |
| 6,733,830 B2 |   | 5/2004 | Todd | |
| 6,998,340 B2 | * | 2/2006 | Tsutae ......................... | 438/624 |
| 2002/0011463 A1 | * | 1/2002 | Buskirk et al. ................. | 216/64 |
| 2003/0216054 A1 | * | 11/2003 | Tsutae ......................... | 438/778 |
| 2006/0009045 A1 | * | 1/2006 | Tsutae ......................... | 438/783 |

FOREIGN PATENT DOCUMENTS

| | | |
|---|---|---|
| JP | 9330926 | 12/1997 |
| JP | 10144683 | 5/1998 |
| JP | 10199873 | 7/1998 |
| JP | 10242142 | 9/1998 |
| JP | 11008235 | 1/1999 |
| JP | 2001267310 | 9/2001 |

* cited by examiner

*Primary Examiner*—Laura M Schillinger
(74) *Attorney, Agent, or Firm*—Volentine & Whitt, P.L.L.C.

(57) ABSTRACT

A method for manufacturing a semiconductor device, in which a substrate is disposed in a chamber and a fluorine-containing silicon oxide film is formed on the substrate using a plasma CVD process. The fluorine-containing silicon oxide film is formed such that the release of fluorine from this silicon oxide layer is suppressed. According to this semiconductor device manufacturing method, a stable semiconductor device can be provided such that the device includes a fluorine-containing silicon oxide film (FSG film) at which the release of fluorine is suppressed, and thus peeling does not occur.

3 Claims, 10 Drawing Sheets

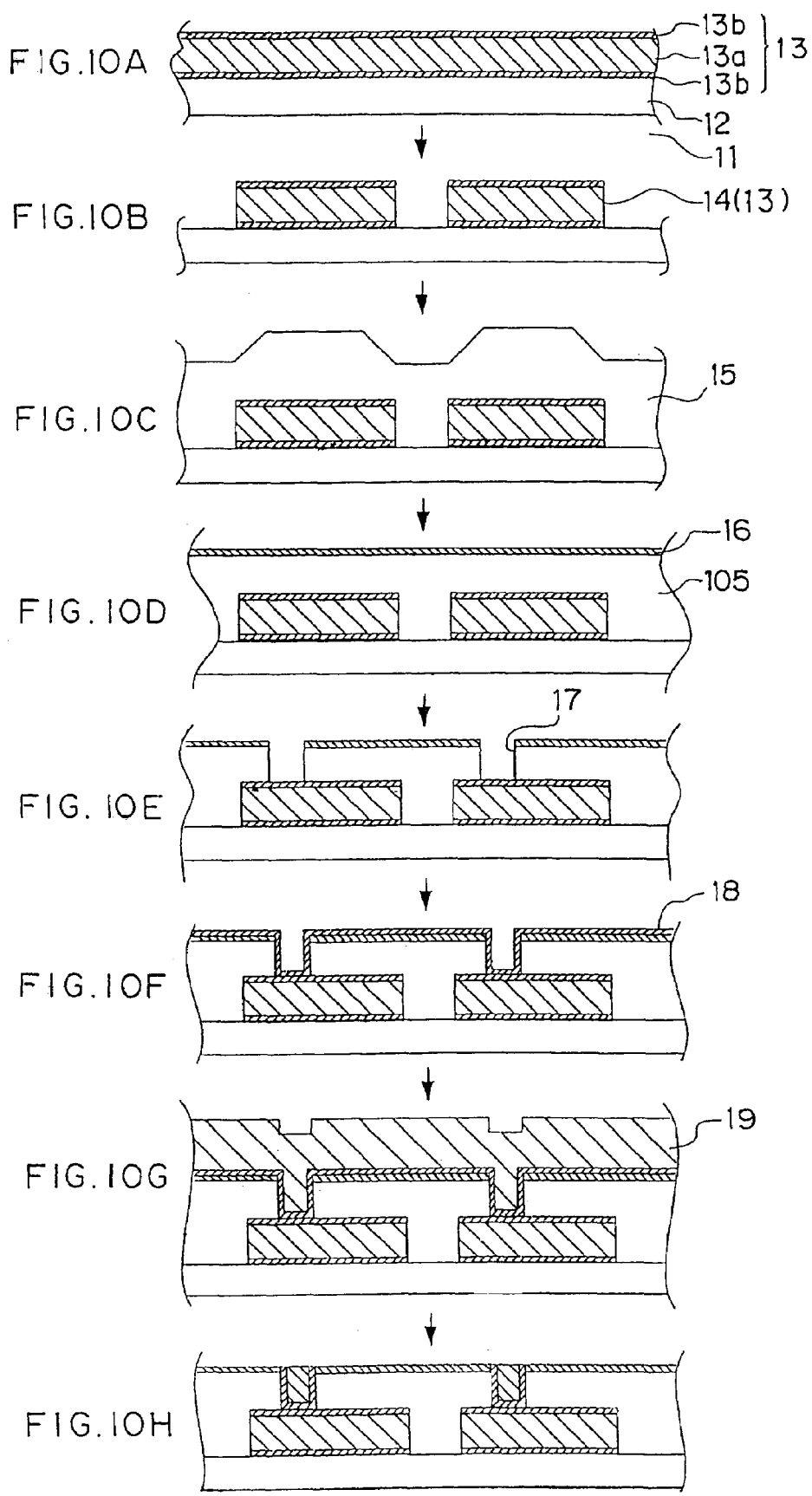

METHOD OF MANUFACTURING SEMICONDUCTOR DEVICE

This is a divisional application of application Ser. No. 10/246,675, filed Sep. 19, 2002, now U.S Pat. No. 6,998,340, which is hereby incorporated by reference in its entirety for all purposes.

BACKGROUND OF THE INVENTION

1. Field of the Invention

The present invention relates to a method for manufacturing a semiconductor device including a silicon oxide film (which film will be sometimes referred to hereafter as an "FSG film") containing fluorine (F), which film serves as an inter-layer insulation film or the like, and more particularly to a method of manufacturing a semiconductor device in which an FSG film is formed by a CVD (chemical vapor deposition) process.

2. Description of the Related Art

Recently, among low-dielectric constant materials which are required as films between layers of metal wiring, FSG films formed by a plasma CVD process have attracted attention. Of these low-dielectric constant materials, FSG films formed by the plasma CVD process undergo relatively little degasification, and are stable films. Moreover, these FSG films have excellent characteristics with regard to filling in of narrow slits.

A process flow for a conventional semiconductor device is shown in FIGS. 10A to 10H.

A metal lamination film 13 is formed by a sputtering process on an insulating layer 12, which is formed on a substrate 11 which includes an unillustrated transistor (FIG. 10A). At the metal lamination film 13, for example, an aluminium alloy 13a and a high melting point metal 13b are layered. Patterning is carried out at this metal lamination film 13, and metal wiring 14 is formed (FIG. 10B). Then, an FSG film 15 of, for example, 1000 nm is formed on the metal wiring 14 and the exposed insulating layer 12 by, for example, a plasma CVD process (FIG. 10C). Thereafter, a surface of the FSG film 15 is levelled by a CMP (chemical and mechanical polishing) process. To suppress the release of fluorine (F) at this time (that is, to prevent fluorine degasification), a silicon-rich film of silicon oxide of, for example, 200 nm is formed to serve as a cap film 16 by, for example, a plasma CVD process (FIG. 10D). Then, through-holes 17 are opened through the FSG film 15 and the cap film 16 (FIG. 10E). After this, a TiN film 18 of, for example, 50 nm is formed on the cap film 16 and hole portions at the through-holes 17 by a sputtering process or CVD process (FIG. 10F). Thereafter, a W (tungsten) film 19 is formed by a CVD process so as to completely fill in the through-holes 17 (FIG. 10G). Finally, the TiN film 18 and the W film 19 are removed by a CMP process except at portions corresponding to the through-holes 17 (FIG. 10H). These steps are repeated a desired number of times, and then heat treatment is performed at around 400° C. in an atmosphere including, for example, $H_2$. Damage is repaired, the first wiring 14 (an aluminium alloy film) is stabilized, and thus a semiconductor device with a multi-layer wiring structure is completed.

However, it has been found that degasification of a portion of the fluorine included in the FSG film occurs, and this fluorine is released. Thus, for example, peeling of the cap film from the FSG film and the like, leading to detachment of wiring peripheries, may occur. Some of this fluorine may be trapped due to the formation of the cap film. However, in the recent semiconductor devices, as the number or layers becomes greater, the total thickness of FSG films increases and the number of heat treatments increases, fluorine degasification cannot be completely prevented, and film peeling at peripheries of the wiring occurs. Furthermore, if the cap film is made thinner, then the effects of fluorine trapping is reduced due to the thinning of the film, when the W film is removed by the CMP process. If the cap film is made thicker, there are problems with an increase of inter-layer volume, etching accuracy and the like. Therefore, it is required that fluorine degasification be suppressed at the FSG film itself and/or that the effect of fluorine trapping by the cap film be enhanced.

SUMMARY OF THE INVENTION

Accordingly, a purpose of the present invention is to solve the above-described problems of the prior art, and to achieve the following objects. That is, an object of the present invention is to provide a method of manufacturing a semiconductor device which includes a fluorine-containing silicon oxide film (FSG film) using a plasma CVD process, in which fluorine release is suppressed, such that the device is stable and free of layer peeling.

The purpose described above is achieved by the following means. A semiconductor device manufacturing method of the present invention is a method including the steps of: disposing a substrate in a chamber; and forming a silicon oxide film that includes fluorine on the substrate using a plasma CVD process, wherein the step of forming the fluorine-including silicon oxide film is carried out such that release of fluorine from the silicon oxide film is suppressed.

In the semiconductor device manufacturing method of the present invention, the semiconductor device including the fluorine-containing silicon oxide film, in which fluorine release is suppressed such that the device is stable and free of layer peeling, can be achieved by forming the fluorine-containing silicon oxide film by using a plasma CVD process such that release of fluorine from the silicon oxide film is suppressed (i.e., fluorine degasification is suppressed).

Releases of fluorine from the fluorine-containing silicon oxide film can be detected by a TDS (thermal desorption spectroscope).

As such a semiconductor device manufacturing method including a step of forming a fluorine-containing silicon oxide film such that release of fluorine from the silicon oxide film is suppressed, preferable examples include manufacturing methods having the following features (1) to (6).

(1) A semiconductor device manufacturing method in which the fluorine-containing silicon oxide layer film is formed with at least two films. A fluorine-containing silicon oxide film that is formed later is formed at a lower film formation temperature than a film formation temperature of a fluorine-containing silicon oxide film that is formed earlier.

A film formation temperature of the fluorine-containing silicon oxide film at the above-mentioned method is higher than temperatures in other steps subsequent to the step of forming the fluorine-containing silicon oxide film. This feature is preferable in view of the fact that heat treatments at temperatures higher than the film formation temperature is not applied at the steps subsequent to the step of forming the fluorine-containing silicon oxide film. Further, it is preferable that the fluorine-containing silicon oxide film is formed at film formation temperatures of not more than 450° C. Here, "other steps" means all steps after the step of forming the fluorine-containing silicon oxide film. When the fluorine-containing silicon oxide film is formed with two or more films, "other steps" means all steps after the respective steps of forming the fluorine-containing silicon oxide films. Thus, as long as processing temperatures of other steps that are performed between the formation of, for example, two fluorine-containing silicon oxide films are lower than the film formation temperature at which the formerly formed fluorine-containing silicon oxide film is formed, the processing temperatures of these intermediate steps may be higher than the film formation temperature of the latterly formed fluorine-containing silicon oxide film.

In an invention based on the above-described feature (1), when a fluorine-containing silicon oxide film of two or more films is formed, the films are formed with a film formation temperature for a fluorine-containing silicon oxide film that is formed later being lower than a film formation temperature of any fluorine-containing silicon oxide film that is formed earlier.

As a result, the later a fluorine-containing silicon oxide film is formed, the greater the concentration of fluorine. That is, a later formed fluorine-containing silicon oxide film functions as a cap film. Therefore, release of fluorine from a lower fluorine-containing silicon oxide film can be suppressed as the films are formed.

Moreover, for the lower fluorine-containing silicon oxide film, no heat treatment at a temperature higher than the film formation temperature of that fluorine-containing silicon oxide film is applied. Therefore, release of fluorine from each of the fluorine-containing silicon oxide films while the films are being formed can be suppressed.

In other words, according to a semiconductor device manufacturing method of the feature (1), a stable semiconductor device can be manufactured having a fluorine-containing silicon oxide film in which the release of fluorine is appropriately suppressed and being free of film peeling. Note that it is assumed that if a heat treatment at a higher temperature than the film formation temperature of the fluorine-containing silicon oxide film is applied for a relatively long time, as in examples of the prior art, release of fluorine from a fluorine-containing silicon oxide film will be more likely, and therefore peeling will be more likely to occur.

(2) A semiconductor device manufacturing method of a first aspect in which, when a fluorine-containing silicon oxide film is formed, the film formation temperature is raised and lowered.

In a semiconductor device manufacturing method including the above feature (2), a film formation temperature when a film is formed is raised and lowered in small increments (rather than being maintained at a constant temperature). Consequently, a total amount of heat applied to the film can be reduced. Accordingly, a stable semiconductor device can be manufactured such that the device has a fluorine-containing silicon oxide film in which the release of fluorine is suitably suppressed, and is free of layer peeling.

(3) A semiconductor device manufacturing method in which a fluorine-containing silicon oxide film is formed under a pressure which is lower than a pressure at which partially decomposed components of raw material gas will be generated by the action of plasma.

In a semiconductor device manufacturing method including the above feature (3), the fluorine-containing silicon oxide film is formed under a pressure lower than a pressure at which the partially decomposed components which are a cause of the release of fluorine from the fluorine-containing silicon oxide film will be generated. In such a method, these partially decomposed components, such as $SiF_2\cdot$ and $SiF_3\cdot$, are less likely to be taken into the silicon film, and thus a stable semiconductor device can be manufactured so that the device has a fluorine-containing silicon oxide film in which the release of fluorine is suitably suppressed, and is free of layer peeling.

(4) A semiconductor device manufacturing method in which, when formation of a fluorine-containing silicon oxide film of one layer is intended, film formation is divided into a number of stages (that is, thin films are formed in that number of cycles, and ultimately the intended single film is obtained) and film formation is temporarily stopped at each stage. When the film formation is stopped, partially decomposed components of $SiF_4$ gas which have been generated by plasma are exhausted from inside the chamber, and then film formation is restarted.

That is, in a semiconductor device manufacturing-method including the above feature (4), a film (one of the thin films that are to be formed) is formed up to a desired film thickness, and then film formation is temporarily halted. Partially decomposed components such as $SiF_2\cdot$ and $SiF_3\cdot$, which are a cause of the release of fluoride from the fluorine-containing silicon oxide film, are removed from inside the chamber, and then film formation is commenced again. Consequently, the partially decomposed components in the fluorine-containing silicon oxide film are less likely to be taken into the silicon oxide film, and a stable semiconductor device can be manufactured so that the device has a fluorine-containing silicon oxide film in which the release of fluorine is suitably suppressed, and is free of layer peeling.

(5) A semiconductor device manufacturing method in which, when a fluorine-containing silicon oxide film is formed, $SiF\cdot$ ($\cdot$represents a radical) is directly introduced into the chamber.

In a semiconductor device manufacturing method including the above feature (5), by directly introducing $SiF\cdot$ into the chamber rather than the raw material gas ($SiF_4$), the $SiF\cdot$ can be more efficiently supplied for film formation. Consequently, a stable semiconductor device can be manufactured so that the device has a fluorine-containing silicon oxide film in which the release of fluorine is suitably suppressed, and is free of layer peeling.

(6) A semiconductor device manufacturing method in which a fluorine-containing silicon oxide film as an object is formed as a single film, comprising the steps of: partitioning the single film of the fluorine-containing silicon oxide film in a thickness direction; and forming a cap film which suppresses the release of fluorine from the fluorine-containing silicon oxide film between the dividedly formed fluorine-containing silicon oxide films, wherein the resulting fluorine-containing silicon oxide film at which the cap film is interposed is formed up to a desired total thickness.

In a semiconductor device manufacturing method including the above feature (6), film formation of the fluorine-containing silicon oxide film is conducted so that the fluorine-containing silicon oxide film is partitioned in the thickness direction and cap films are formed between the dividedly formed fluorine-containing silicon oxide films. Further, film formation is controlled such that the resulting fluorine-containing silicon oxide film at which the cap films are interposed is formed to a desired total thickness. Therefore, when a heat treatment is performed on the fluorine-containing silicon oxide film, all free fluorine in the fluorine-containing silicon oxide films collects at the cap films or in vicinities thereof. Because the at least one cap film is interposed in the resulting fluorine-containing silicon oxide film, the fluorine can be more assuredly trapped at the fluorine-containing silicon oxide film, as compared with the conventional structure. Therefore, a stable semiconductor device can be manufactured so that the device has a fluorine-containing silicon oxide film in which the release of fluorine is suitably suppressed, and is free of layer peeling.

The semiconductor device manufacturing method of the present invention is particularly suitable for semiconductor device manufacturing methods that are for manufacturing semiconductor devices with multi-layer wiring structures, which methods include a step of forming wiring on a substrate and a step of forming a fluorine-containing silicon oxide film, which steps are plurally repeated.

BRIEF DESCRIPTION OF THE DRAWINGS

FIGS. 10A-10H are schematic diagrams showing an example of process flow of a semiconductor device manufacturing method of the prior art.

DESCRIPTION OF THE PREFERRED EMBODIMENTS

Figure 1:
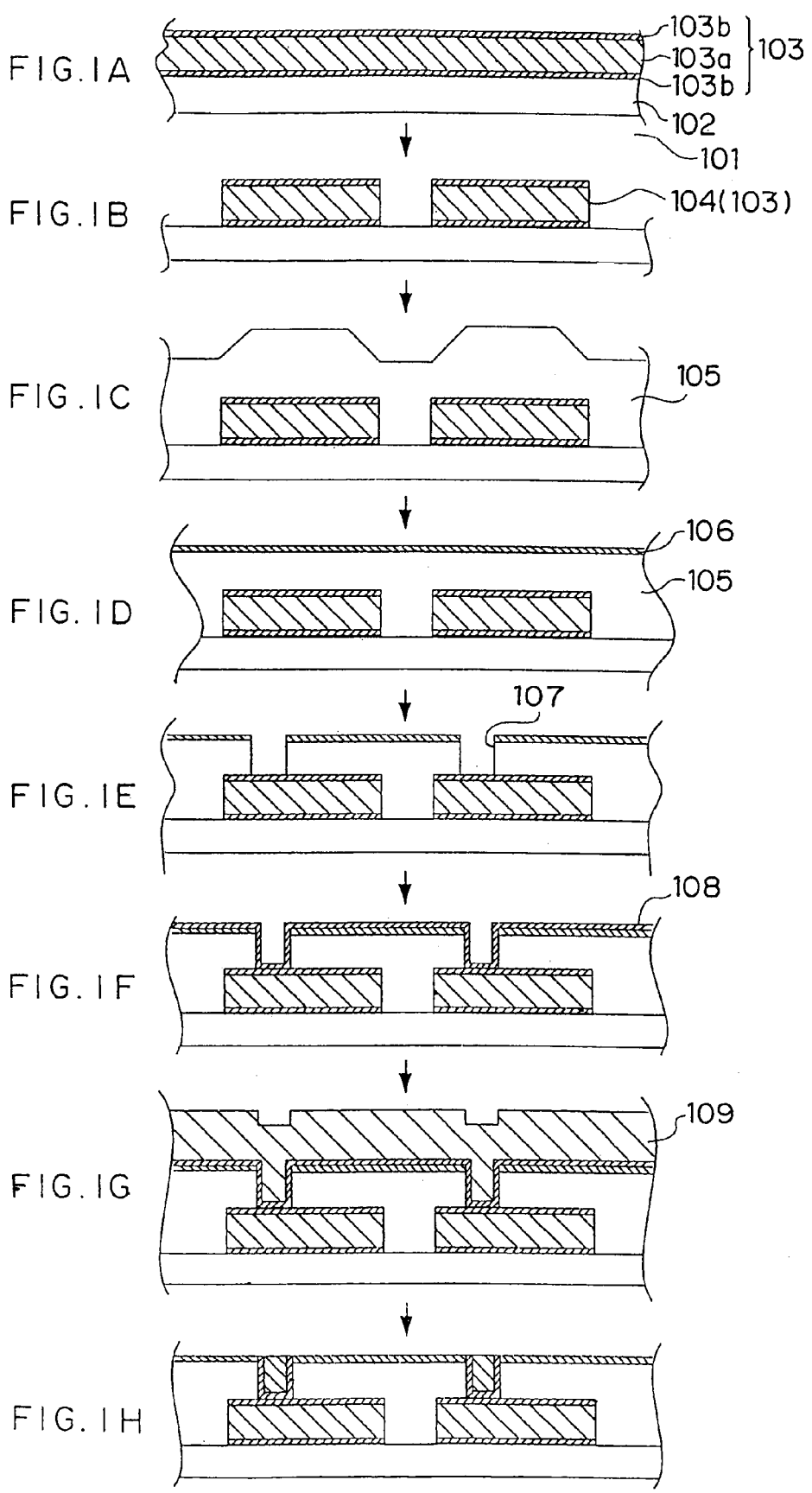
FIGS. 1A-1H are schematic diagrams showing an example of process flow of a semiconductor device manufacturing method of the present invention.

Below, an example of an embodiment of the present invention will be explained with reference to the drawings. In the explanation, components that have substantially the same functions are given the same reference numerals throughout the drawings, and descriptions thereof may be omitted where appropriate.

First Embodiment

Figure 2:
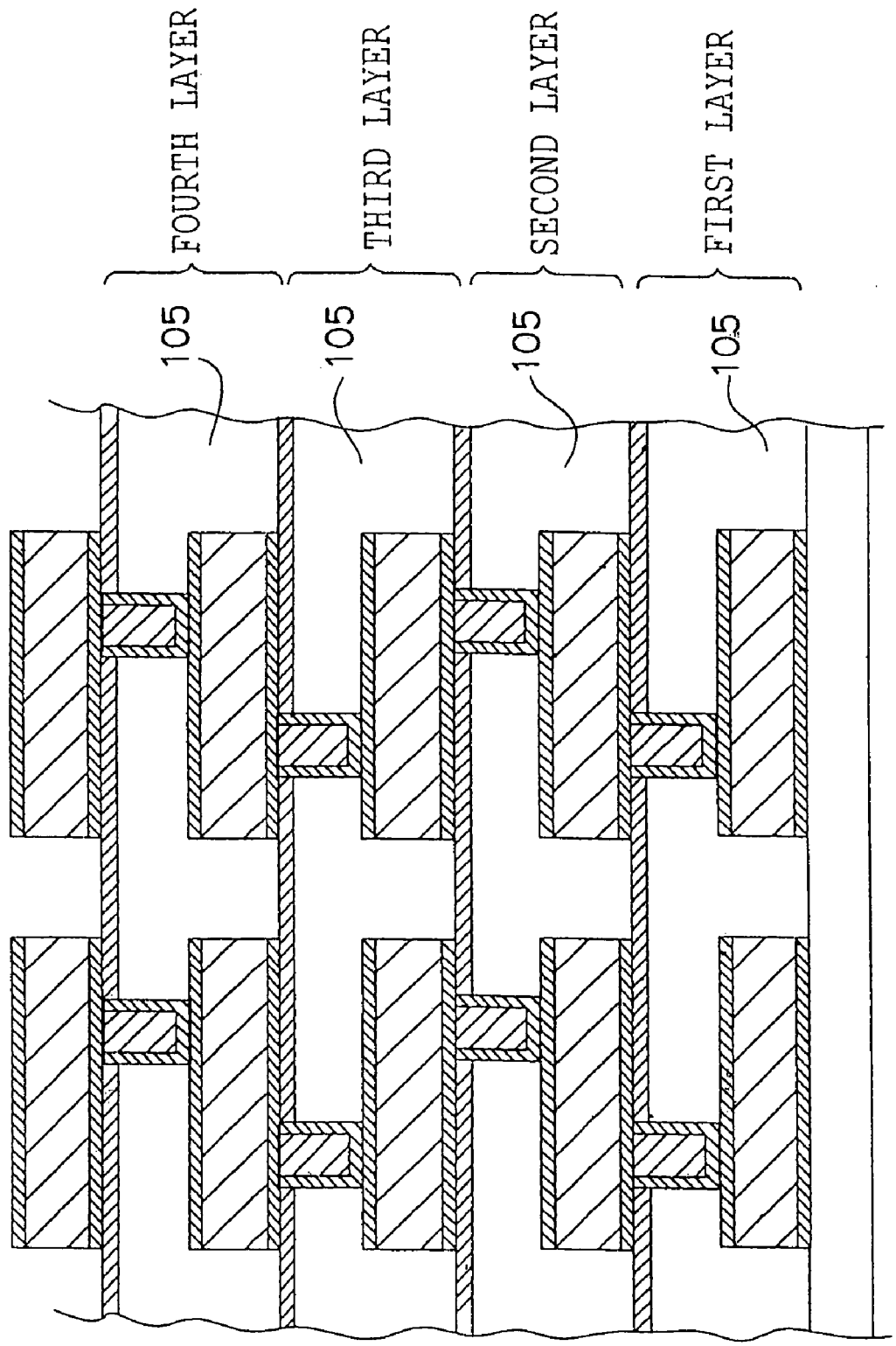
FIG. 2 is a schematic structural diagram showing an example of a semiconductor device obtained by the semiconductor device manufacturing method of the present invention.

FIGS. 1A to 1H show an example of process flow of a semiconductor device in a first embodiment. A metal lamination film 103 is formed by a sputtering process on an insulating layer 102, which is formed on a substrate 101 which includes an unillustrated transistor (FIG. 1A). At the metal lamination film 103, for example, an aluminium alloy 103a and a high melting point metal 103b are layered. Patterning is carried out at this metal lamination film 103, and metal wiring 104 is formed (FIG. 1B). Then, an FSG film 105 of, for example, 1000 nm is formed on the metal wiring 104 and the exposed insulating layer 102 by, for example, a plasma CVD process (FIG. 1C). Thereafter, a surface of the FSG film 105 is levelled by a CMP (chemical and mechanical polishing) process. To suppress the release of fluorine (F) at this time (that is, to prevent fluorine degasification), a silicon-rich film of silicon oxide of, for example, 200 nm is formed to serve as a cap film 106 by, for example, a plasma CVD process (FIG. 1D). Then, through-holes 107 are opened through the FSG film 105 and the cap film 106 (FIG. 1E). After this, a TiN film 108 of, for example, 50 nm is formed on the cap film 106 and hole portions at the through-holes 107 by a sputtering process or CVD process (FIG. 1F). Thereafter, a W (tungsten) film 109 is formed by a CVD process so as to completely fill in the through-holes 107 (FIG. 1G). Finally, the TiN film 108 and the W film 109 are removed by a CMP process except at portions corresponding to the through-holes 107 (FIG. 1H). These steps are repeated a desired number of times (four times in the first embodiment), and then heat treatment is performed at around 400° C. in an atmosphere including, for example, $H_2$. Damage is repaired, the first wiring 104 (an aluminium alloy film) is stabilized, and thus a semiconductor device with a multi-layer wiring structure as shown in FIG. 2 is completed. The semiconductor device with a multi-layer wiring structure shown in FIG. 2 has a four-layer structure, and the first, the second, the third and the fourth FSG films 105, 105, 105, 105 are formed on the substrate in this order.

Now, FSG film-forming conditions in the plasma CVD process are illustrated. In a plasma CVD device shown in FIG. 3, raw material gas is supplied by a gas injector 201 disposed in a chamber 200. The raw material gas may be, for example, $SiH_4/SiF_4/O_2/Ar$ in amounts of 40/70/180/125 sccm, respectively. While the raw material gas is injected, gas is discharged from the chamber 200 through a discharge port 202, maintaining a pressure of around 4 mTorr (0.5332 Pa). Plasma is generated by, for example, an output power of 4200 W at a frequency of 400 kHz from a bell jar 203, which serves as an upper electrode. Thus, an FSG film is formed on a substrate 205 by plasma excitation of the $SiH_4$, $SiF_4$ and $O_2$ gases. At the same time, an RF bias with, for example, an output power of 1500 W and a frequency of 13.56 MHz is applied from an electrostatic chuck 204 at the substrate 205 side. The Ar and $O_2$ gases collide with the substrate 205, and sputter-etching of the FSG film on the substrate 205 is carried out. Thus, inter-layer film structures as narrow slits, which are suitably filled in, are provided. Film formation temperature control during film formation is implemented by He pressure from He delivery piping 206 which introduces He through the electrostatic chuck 204 toward a rear side of the substrate 205.

Now, an example of film formation conditions of a cap film formed by a plasma CVD process is described. In the plasma CVD device shown in FIG. 3, raw material gas is supplied by the gas injector 201 disposed in the chamber 200. The raw material gas may be, for example, $SiH_4/O_2/Ar$ in amounts of 180/340/240 sccm, respectively. While the raw material gas is injected, gas is discharged from the chamber 200 through the discharge port 202, maintaining a pressure of around 5 mTorr (0.6665 Pa). Plasma is generated by, for example, an output power of 3500 W at a frequency of 400 kHz from the bell jar 203, which is an upper electrode. Thus, a Si-rich silicon oxide film as the cap layer is formed as the cap layer on the substrate 205 by plasma excitation of the $SiH_4$ and $O_2$ gases. Here, the cap layer for trapping fluorine is formed as a Si-rich silicon oxide film by increasing the flow rate of $SiH_4$ gas.

Figure 3:
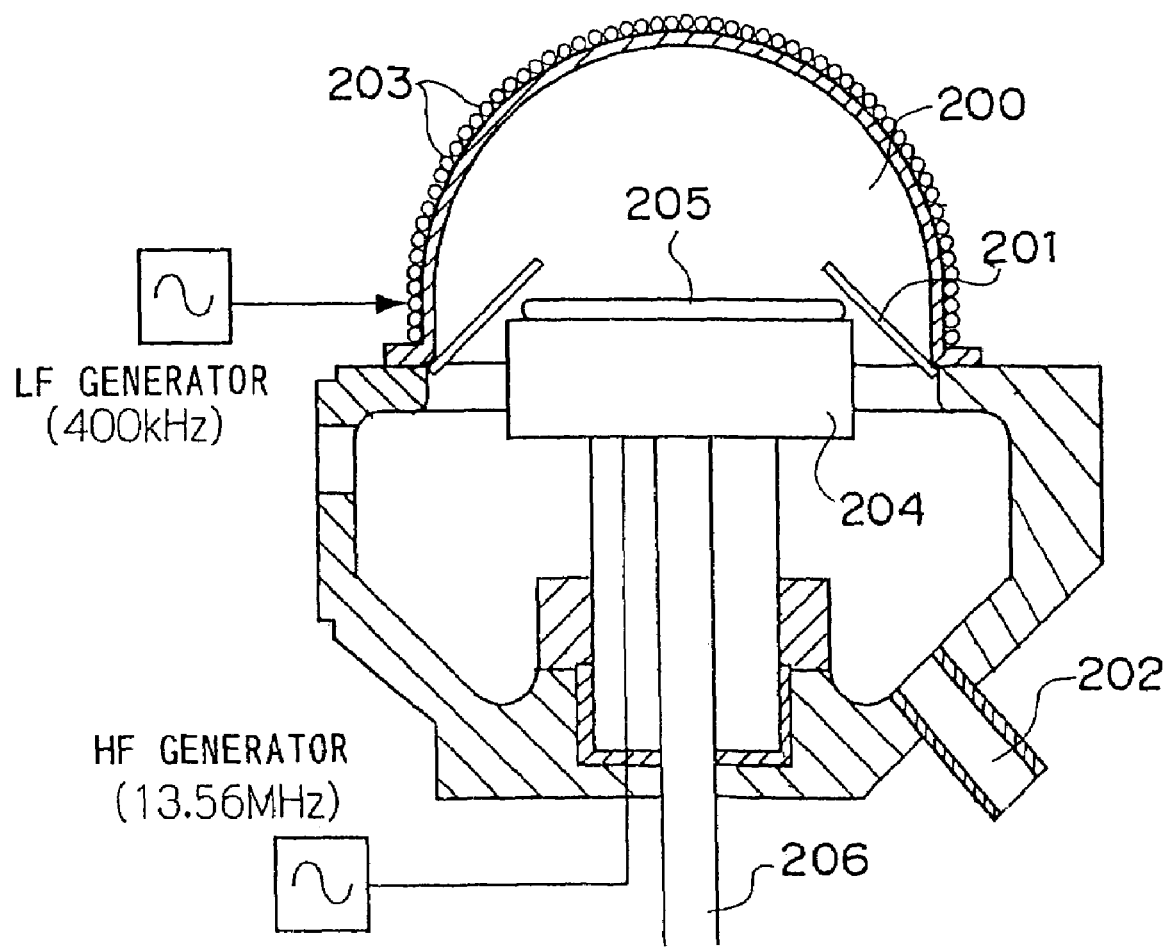
FIG. 3 is a schematic structural diagram showing an example of a plasma CVD device used in a semiconductor device manufacturing method relating to a first embodiment of the present invention.

During formation of the first FSG film 105 in the first embodiment, He is introduced toward the rear side of the substrate 205 from the He delivery piping 206 in the plasma CVD device shown in FIG. 3, and the He pressure is set to about 4 Torr (533.2 Pa). Thus, this film is formed at a film formation temperature of around 440° C. When the second FSG film 105 is formed, this film is formed in the same manner as the first FSG film, except that the film formation temperature is set around 430° C. due to the He pressure being set to 4.5 Torr (599.85 Pa). When the third FSG film 105 is formed, this film is formed in the same manner as the first FSG film, except that the film formation temperature is set around 420° C. due to the He pressure being set to 5 Torr (666.5 Pa). When a fourth the FSG film 105 is formed, this film is formed in the same manner as the first FSG film, except that the film formation temperature is set around 410° C. due to the He pressure being set to 5.5 Torr (733.15 Pa). Thus, each FSG film is formed such that the film formation temperature of a later formed FSG film 105 is lower than the film formation temperature of an earlier formed FSG film 105. Furthermore, film formation temperatures of the cap film 106, the W film 109 and the like, which are formed by sputtering processes and/or CVD processes, and temperatures at which CMP processes and the like are carried out, are set to not more than 400° C., and subsequent heat treatments are carried out at a temperature not more than 400° C.

Figure 4:
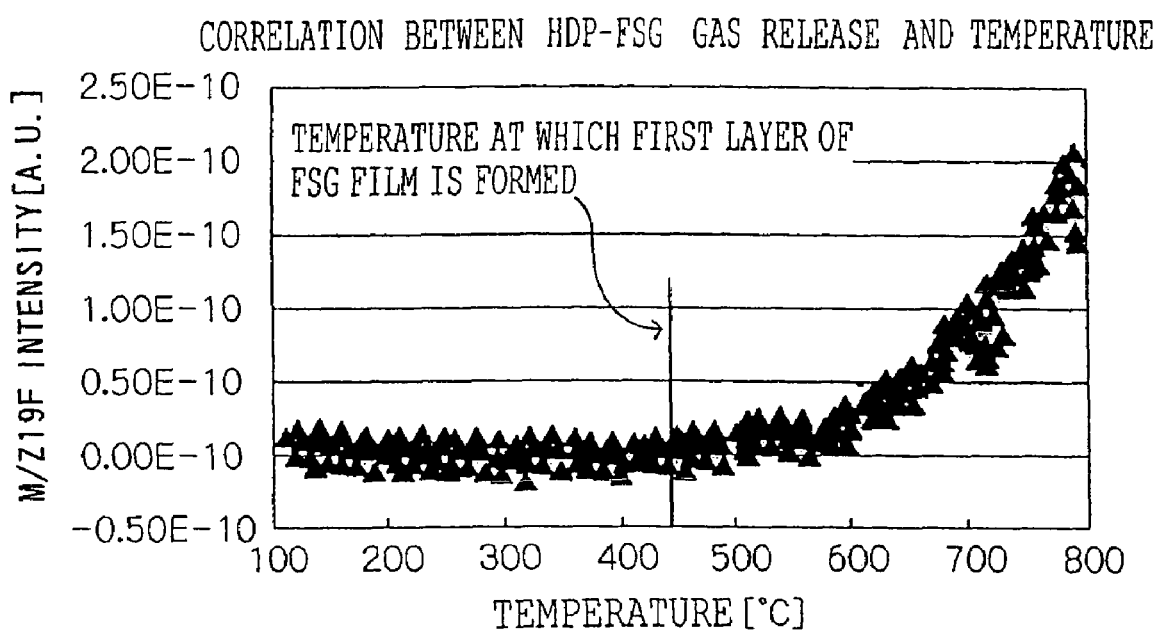
FIG. 4 is a graph showing correlation between amounts of fluorine degasification (HDP-FSG gas release) and temperature.

FIG. 4 exemplifies dependence of the amount of fluorine degasification at a HDP (high density plasma)-FSG film, on temperature. As is shown in FIG. 4, it can be seen that fluorine degasification is suppressed, even when a heat treatment of the FSG film is carried out, if the temperature is not more than the film formation temperature (in the first embodiment, not more than the film formation temperature of the first FSG film, which is 440° C.). As is also shown in FIG. 4, it can be seen that it is appropriate that each FSG film is formed at a film formation temperature that is preferably not more than 500° C., and more preferably not more than 450° C., and that other steps (steps subsequent to formation of the first FSG film 105) are carried out at processing temperatures in these ranges.

Now, a relationship of helium pressure and film formation temperature during film formation with fluorine concentration (a ratio of SiF/SiO) in the FSG film that is obtained is shown. From this relationship, it can be seen that the fluorine concentrations of the FSG films provided in the first embodiment are higher for the higher layers.

| He pressure | Film formation temperature | Fluorine concentration |
| --- | --- | --- |
| 4 Torr (533.2 Pa) | 440° C. | 3.47 |
| 5 Torr (666.5 Pa) | 420° C. | 3.84 |
| 6 Torr (799.8 Pa) | 400° C. | 4.15 |

Accordingly, the FSG films are formed with the film formation temperature of a later formed FSG film being lower than the film formation temperature of an earlier formed FSG film. Specifically, the film formation temperature is slightly lower each time an FSG film is formed, and thus the higher layers have higher fluorine concentrations. As a result, the higher FSG films function as "cap films" for the lower FSG films, and film formation can be carried out with the release of fluorine from the lower FSG films being suppressed. In other words, a semiconductor device with a stabilized multi-layer wiring structure, including FSG films at which the release of fluorine is suppressed and being free of layer peeling, can be constituted.

Moreover, other steps subsequent to the formation of the first FSG film 105 in the first embodiment are carried out at processing temperatures lower than the film formation temperature at which the fourth FSG film is formed. Each FSG film is formed at a temperature higher than the processing temperature of other steps subsequent to the formation of that FSG film. Consequently, heat processing at temperatures higher than the film formation temperature of that FSG film will not be applied throughout the entire process, and the release of fluorine from the FSG film can be suppressed. In other words, a semiconductor device with a stabilized multi-layer wiring structure, including FSG films at which the release of fluorine is suppressed and being free of layer peeling, can be more suitably constituted.

Second Embodiment

Figure 5A:
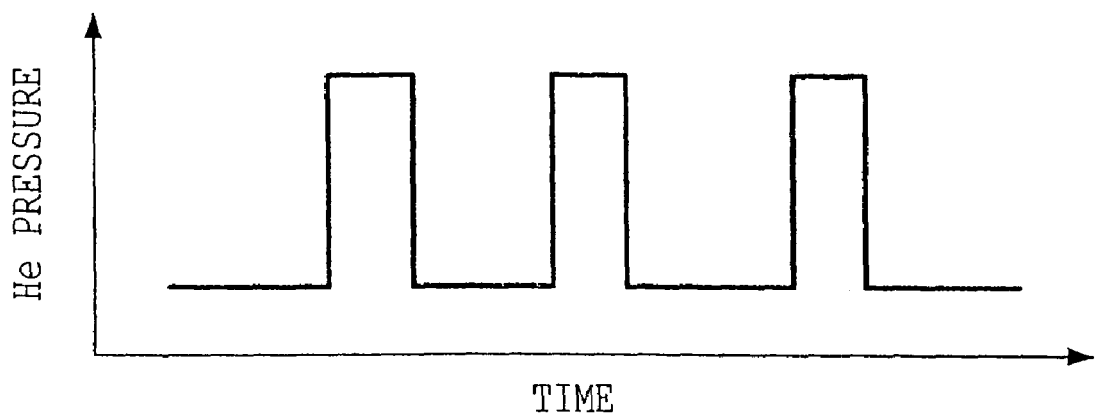
FIG. 5A is a graph showing an example of film formation temperature raising and lowering conditions when forming an FSG film based on a second embodiment of the present invention.
Figure 5B:
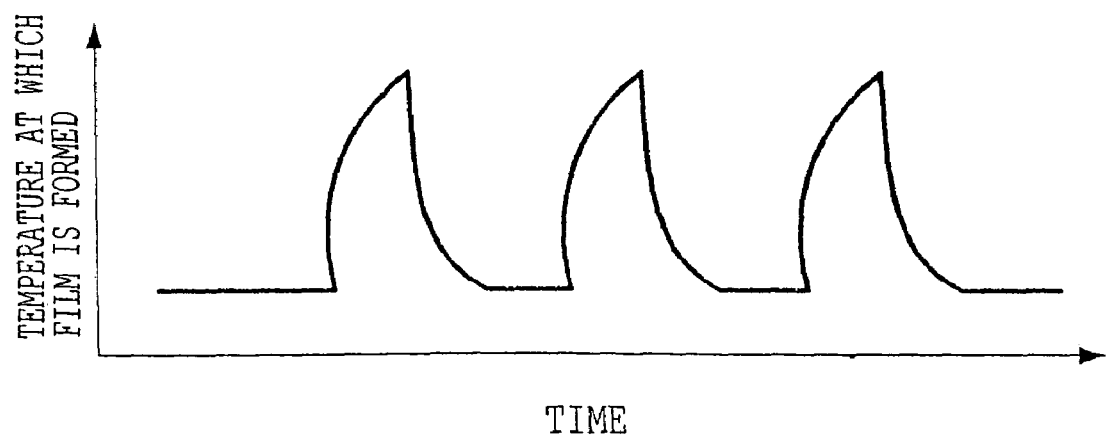
FIG. 5B is a graph showing an example of film formation temperature raising and lowering conditions when forming an FSG film based on the second embodiment of the present invention.

In a second embodiment, when a semiconductor device having a multi-layer wiring structure similar to the structure in the first embodiment is being constituted, the He pressure is varied. The He pressure is introduced from the He delivery piping 206 toward the rear side of the substrate 205 in the plasma CVD device shown in FIG. 3. The He pressure is varied as shown in FIG. 5A over cycles of, for example, 10 seconds. Consequently, the film formation temperature rapidly rises and falls as shown in FIG. 5B. Accordingly, in the second embodiment, the first FSG film 105 is formed while the film formation temperature is varied in a range of, for example, 390 to 490° C. by raising and lowering of the substrate temperature. In the same way, the second FSG film 105 is formed with the film formation temperature being varied in a range of, for example, 380 to 480° C., the third FSG film 105 is formed with the film formation temperature being varied in a range of, for example, 370 to 470° C., and the fourth FSG film 105 is formed with the film formation temperature being varied in a range of, for example, 360 to 410° C.

Suitable conditions of raising and lowering the film formation temperature are: film formation temperatures in the range of 400 to 450° C.; a temperature range by which the temperature is raised and lowered in a range from 50 to 100° C.; and a raising and lowering interval of 10 to 20 seconds.

Accordingly, because the film formation temperature is raised and lowered during formation of the FSG films in the second embodiment, a total amount of heat applied to the FSG films (particularly to the lower FSG films) can be made smaller, and the FSG films can be formed while the release of fluorine therefrom is suppressed. Therefore, a semiconductor device with a stabilized multi-layer wiring structure, including FSG films at which the release of fluorine is suppressed and being free of layer peeling, can be constituted. This is presumably because, even though the film formation temperature reaches relatively high levels during FSG film formation, the temperature is lowered before release of fluorine from the FSG film can commence, due to the raising and lowering of the film formation temperature as described above. Therefore, the FSG films can be formed at higher temperatures in the second embodiment than in the first embodiment. Moreover, because the total amount of heat applied to the substrate can be similarly reduced, a semiconductor device with a multi-layer wiring structure can be constituted without increasing the resistance of the metal wiring.

Furthermore, the release of fluorine from the FSG films can be suppressed by raising and lowering temperatures at the processing of other steps (steps subsequent to the formation of the first FSG film 105) in the same way. Thus, a semiconductor device with a stabilized multi-layer wiring structure, including FSG films at which the release of fluorine is suppressed and being free of layer peeling, can be more suitably constituted.

Third Embodiment

In a third embodiment, when a semiconductor device having a multi-layer wiring structure similar to the structure in the first embodiment is produced, formation of the FSG films is performed at a pressure lower than the pressure at which partially decomposed components ($SiF_3\cdot$ and $SiF_2\cdot$) of the $SiF_4$ gas (the raw material gas) are generated. In the present embodiment, this means that a pressure in the chamber 200 of the plasma CVD device shown in FIG. 3 is, for example, 2 mTorr (0.2666 Pa).

Commonly, fluorine is present in the chamber in the form of $SiF_4$ gas and $SiF_3\cdot$, $SiF_2\cdot$ and $SiF\cdot$ radicals decomposed by the plasma ("·" represents a radical). Consequently, as film formation proceeds, the $SiF\cdot$, which has the highest energy, is consumed to form the FSG film. When $SiF\cdot$ becomes sparse in the chamber, $SiF_2\cdot$, which has the next highest energy, and/or $SiF_3\cdot$ are more likely to be taken in by the FSG film. These partially decomposed components, the $SiF_2\cdot$ and $SiF_3\cdot$, are a cause of the release of fluorine. Accordingly, in the third embodiment, because the pressure in the chamber is set to a low pressure of 2 mTorr (0.2666 Pa), as compared with the conventional pressure of around 4 mTorr (0.5332 Pa), the generation of partially decomposed components ($SiF_3\cdot$ and $SiF_2\cdot$) of the $SiF_4$ gas (raw material gas) is suppressed, the proportion of $SiF\cdot$ present in the chamber is increased, and the $SiF\cdot$ can be supplied continuously.

The pressure during film formation is not necessarily limited to 2 mTorr (0.2666 Pa), and may be any pressure at which the generation of the partially decomposed components ($SiF_3\cdot$ and $SiF_2\cdot$) of the $SiF_4$ gas (raw material gas) is suppressed. The pressure during film formation works in combination with the film formation temperature, a deposition rate (film formation speed) and the like. Therefore, the pressure during film formation is preferably not more than 2 mTorr (0.2666 Pa), and is more preferably from 1 to 2 mTorr (0.1333 to 0.2666 Pa).

Accordingly, because, in the third embodiment, as the FSG films are formed at the low pressure of 2 mTorr (0.2666 Pa) such that the generation of partially decomposed components ($SiF_3\cdot$ and $SiF_2\cdot$) of the $SiF_4$ gas (raw material gas) is suppressed, a semiconductor device with a stabilized multi-layer wiring structure, including FSG films at which the release of fluorine is suppressed and being free of layer peeling, can be constituted.

Fourth Embodiment

Figure 6:
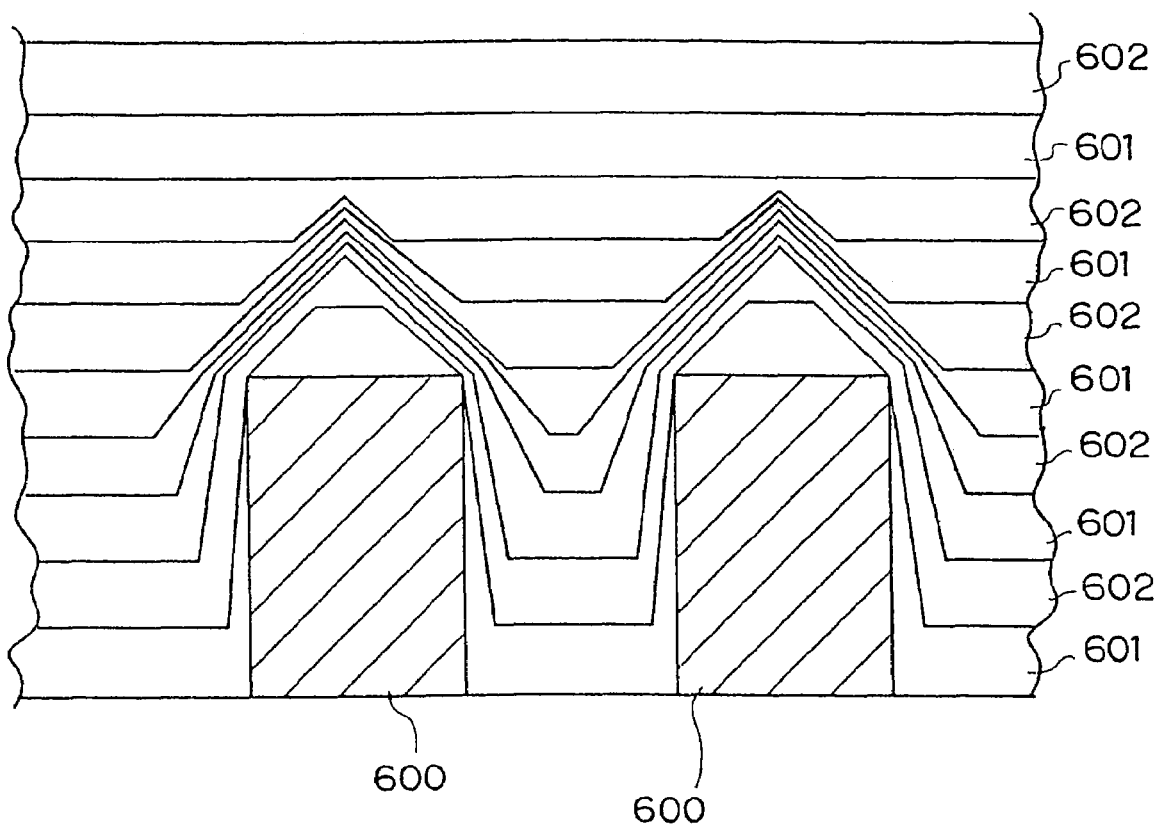
FIG. 6 is a schematic structural diagram for explaining an example of an FSG film formation method in a semiconductor device manufacturing method relating to a fourth embodiment of the present invention.

In a fourth embodiment, when a semiconductor device having a multi-layer wiring structure similar to the structure in the first embodiment is constituted, each FSG film is formed with metal wiring 600 being formed and then an FSG film 601 of, for example, 100 nm being formed thereon, as shown in FIG. 6. Next, plasma application and gas introduction are temporarily halted, and the chamber is evacuated to a near-vacuum state with an interior pressure of, for example, 1 mTorr (0.1333 Pa). Then a further FSG film 602 of 100 nm is formed. Thereafter, this process is repeated until a desired film thickness is formed.

Commonly, as explained for the third embodiment, fluorine is present in the chamber in the form of $SiF_4$ gas and $SiF_3\cdot$, $SiF_2\cdot$ and $SiFg\cdot$ radicals decomposed by the plasma, and these $SiF_2\cdot$ and $SiF_3\cdot$ partially decomposed components are a cause of the release of fluorine. Consequently, if, as in this fourth embodiment, an FSG film is partially formed to a desired thickness (e.g., the FSG film 601), this film formation is temporarily halted, the chamber is evacuated to the near-vacuum state with an interior pressure of 1 mTorr (0.1333 Pa) and the $SiF_2\cdot$ and $SiF_3\cdot$ partially decomposed components are discharged, then the proportion of $SiF\cdot$ that is present in the chamber becomes high again when formation of the FSG film is re-commenced, and $SiF_2\cdot$ and $SiF_3\cdot$ are less likely to be taken into the FSG film.

Accordingly, in the fourth embodiment, by temporarily stopping formation of the FSG film, discharging the $SiF_3\cdot$ and $SiF_2\cdot$ as partially decomposed components from inside the chamber and then re-starting film formation, and repeating these steps, a semiconductor device with a stabilized multi-layer wiring structure, including FSG films of desired thickness at which the release of fluorine is suppressed and being free of layer peeling, can be constituted.

Furthermore, because in the fourth embodiment pressure does not fall in the chamber during formation of the FSG film, the FSG film can be formed without a reduction of film formation speed.

Fifth Embodiment

Figure 7:
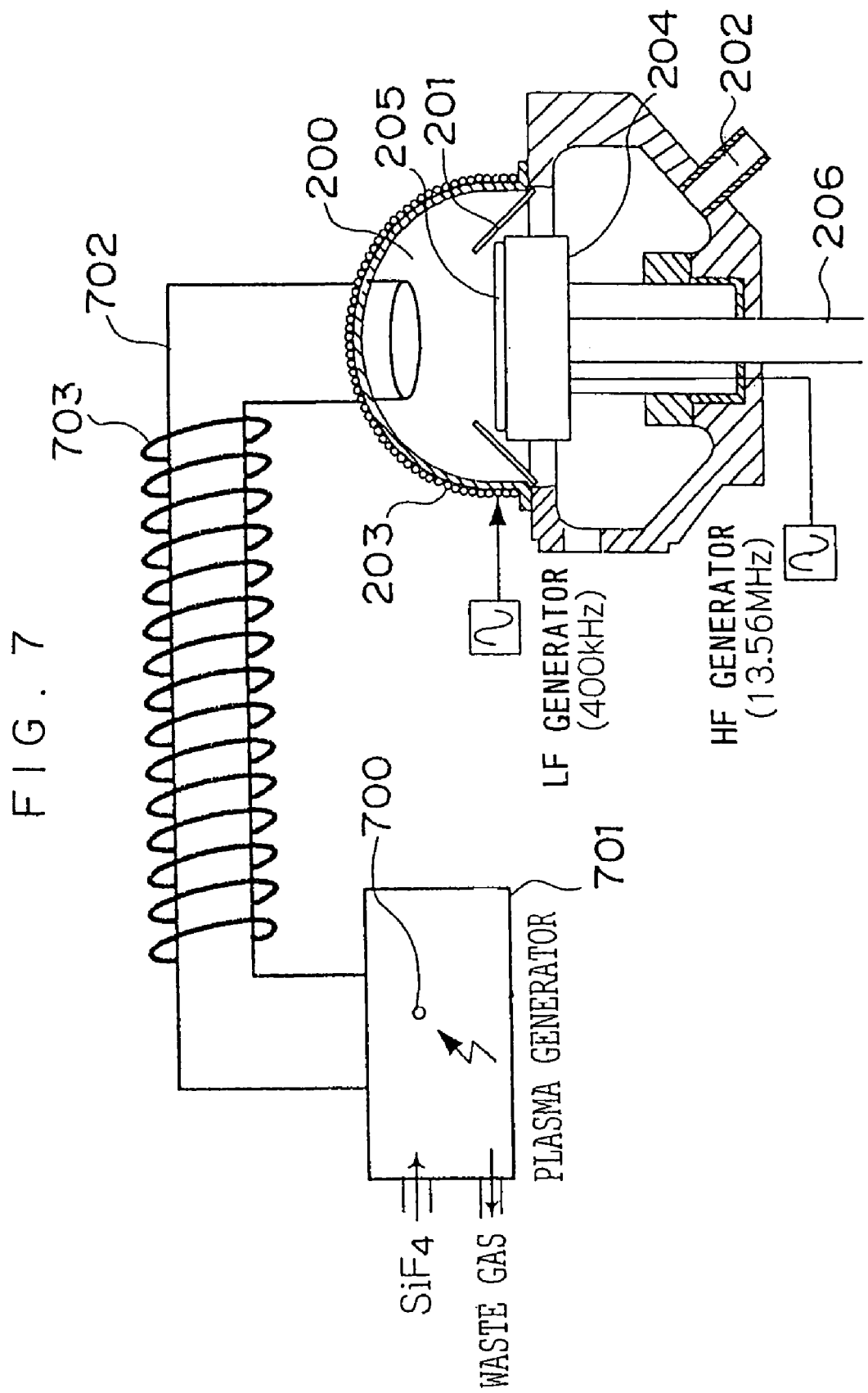
FIG. 7 is a schematic structural diagram showing an example of a plasma CVD device used in a semiconductor device manufacturing method relating to a fifth embodiment of the present invention.

In a fifth embodiment, when a semiconductor device having a multi-layer wiring structure similar to the structure in the first embodiment is constituted, each FS G film is formed using a plasma CVD device shown in FIG. 7. The plasma CVD device shown in FIG. 7 is structured in the same way as the plasma CVD device shown in FIG. 3, except that a plasma generator 701 and delivery piping 702 are provided. At the 701, $SiF_4$ gas is introduced and $SiF\cdot$ 700 is generated. The delivery piping 702 introduces the $SiF\cdot$ 700 from the plasma generator 701 into the chamber 200.

At the plasma CVD device shown in FIG. 7, $SiF_4$ gas is introduced into the plasma generator 701, the SiF. 700 is generated, and the $SiF\cdot$ 700 is introduced from the delivery piping 702 into the chamber 200. Introduction of the $SiF\cdot$ 700 into the chamber 200 is implemented by a magnetic field which is generated by a coil 703 wound at the delivery piping 702. The plasma generator 701 is provided with an exhaust line of its own. Thus, the plasma generator 701 is maintained at the same pressure as the chamber 200. Resultantly, movement of the $SiF_4$ gas through the delivery piping 702 is prevented. In the chamber 200, only $O_2$ and Ar are supplied from the gas injector 201, and the $SiF\cdot$ is supplied from the delivery piping 702. Thus, plasma treatment is carried out and the FSG film is formed in the same way as in the first embodiment.

In the plasma CVD device shown in FIG. 7, the $SiF\cdot$ 700 generated at the plasma generator 701 has a high polarity. Therefore, the $SiF\cdot$ 700 is introduced into the chamber 200 by the magnetic field in precedence over the partially decomposed components $SiF_3\cdot$ and $SIF_2\cdot$. Furthermore, even if the partially decomposed components $SiF_3\cdot$ and $SiF_2\cdot$ are introduced into the chamber 200, plasma energy that is commonly used for decomposing supplied $SiF_4$ gas can be used for decomposing this $SiF_2\cdot$ and $SiF_3\cdot$. Thus, the proportion in which the $SiF\cdot$ is present in the chamber can be made higher. Accordingly, $SiF\cdot$ can be provided more efficiently for film formation, and the partially decomposed components $SiF_2\cdot$ and $SiF_3\cdot$ are less likely to be taken into the film.

In this manner, in the fifth embodiment, by introducing the $SiF\cdot$ directly into the chamber, a semiconductor device with a stabilized multi-layer wiring structure, including FSG films at which the release of fluorine is suppressed and being free of layer peeling, can be constituted.

The present embodiment is not limited to the plasma CVD device shown in FIG. 7. As long as the SiF· can be directly introduced into the chamber 200, an arbitrary plasma CVD device can be used.

Sixth Embodiment

Figure 8:
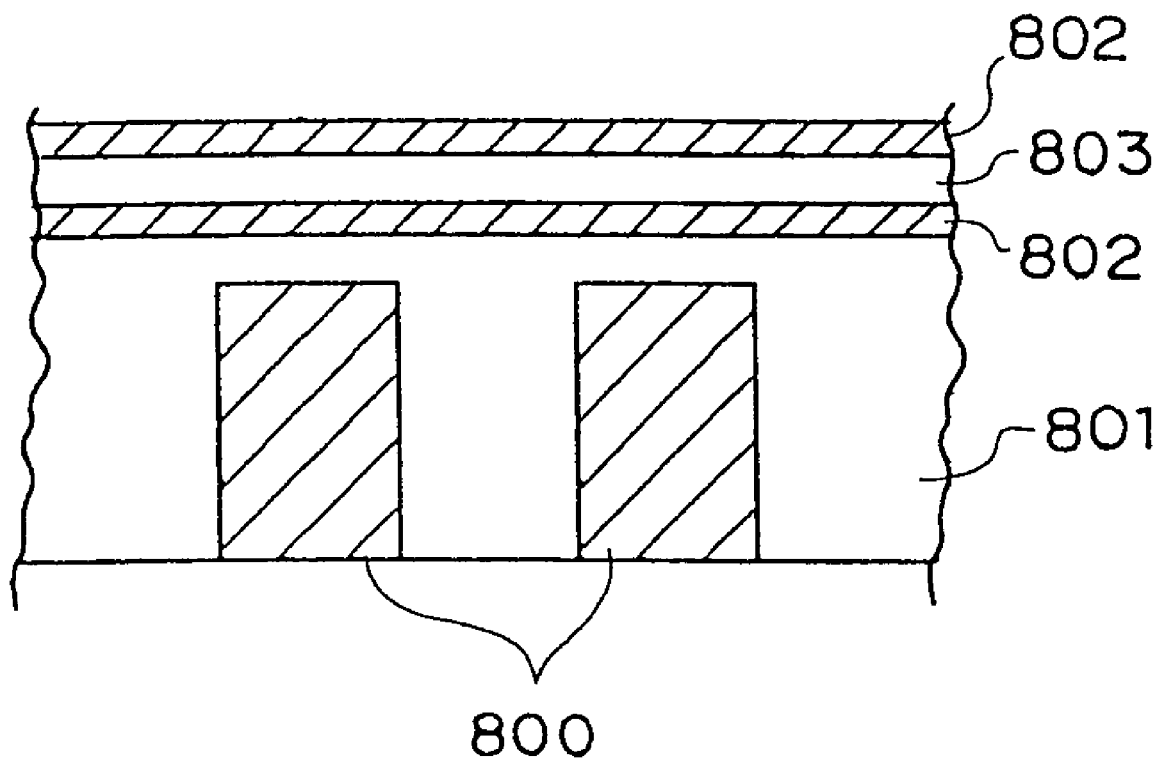
FIG. 8 is a schematic structural diagram for explaining an example of an FSG film formation method in a semiconductor device manufacturing method relating to a sixth embodiment of the present invention.
Figure 9:
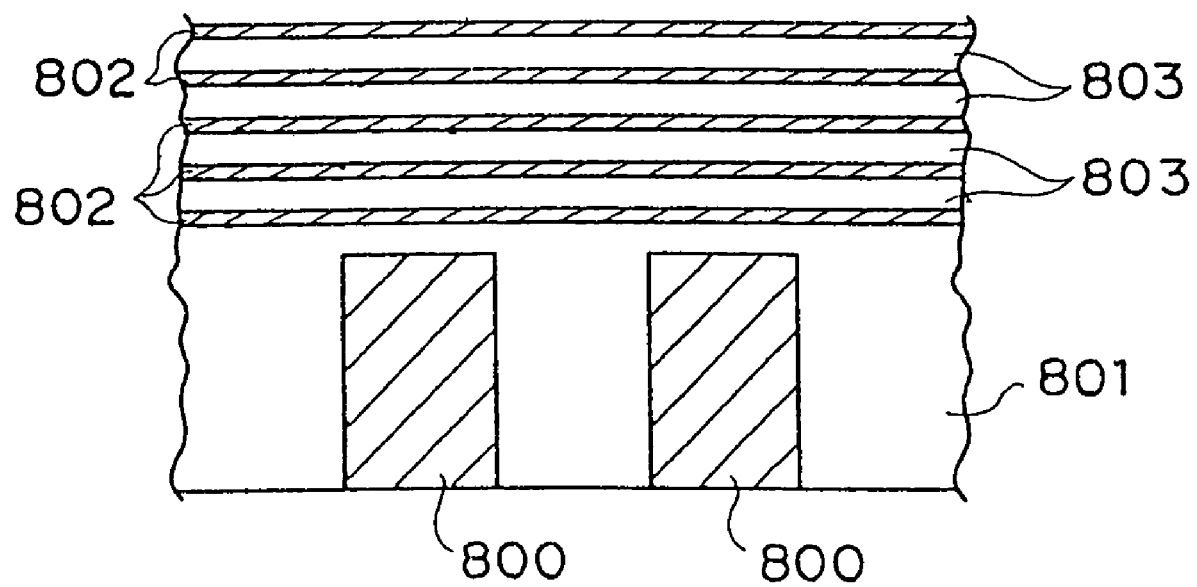
FIG. 9 is a schematic structural diagram for explaining an example of an FSG film formation method in a semiconductor device manufacturing method relating to the sixth embodiment of the present invention.

In a sixth embodiment, when a semiconductor device having a multi-layer wiring structure similar to the structure in the first embodiment is constituted, each FSG film is formed, with metal wiring 800 first being formed, an FSG film 801 is formed thereafter, and the FSG film 801 on the metal wiring 800 being removed by a CMP process such that a remaining film thickness is, for example, 200 nm, as shown in FIG. 8. Then, to suppress the release of fluorine, a silicon-rich film of silicon oxide of, for example, 100 nm is formed on the FSG film 801 to serve as a cap film 802. Furthermore, an FSG film 803 is formed to a thickness of, for example, 200 nm on the cap film 802, and a silicon-rich film of silicon oxide of, for example, 100 nm is similarly formed on the FSG film 803 as another the cap film 802 for suppressing the release of fluorine. In this way, an intended single-layer FSG film is dividedly formed, so that the resulting FSG film is formed to a desired thickness with a cap film interposed. Further, by repeating this film formation a number of times, the FSG film can be formed to a desired thickness with a plurality of cap films interposed, as shown in FIG. 9. Here, each film is formed to be thin, with, for example, a film thickness of 80 nm and the cap films 802 being 20 nm.

A conventional semiconductor device has a structure in which a cap film is formed only on a top surface of an FSG film. When a heat treatment is performed on such a structure, all free fluorine in the FSG film collects at or in the vicinity of the cap film. As a result, not all of the fluorine can be trapped in the cap film. This phenomenon becomes remarkable if the cap film is over-polished by a CMP process. In contrast, in the sixth embodiment of the present invention, the FSG films and the cap films are formed continuously and alternatingly. Therefore, an FSG film of a desired thickness can be obtained with at least one cap film interposed therein. Thus, fluorine from the FSG film can be more assuredly trapped.

Moreover, if the free fluorine in the FSG film collects at a single place, there is non-uniformity of a fluorine profile in the FSG film. As a result, portions with high capacity but little fluorine occur. If there is a portion with high capacity even at one place, a disadvantage of a total inter-layer capacity being higher is caused. In the sixth embodiment of the present invention, because the FSG films and the cap films are formed continuously and alternatingly, the FSG film is formed to a desired thickness with the cap films interposed therein. Therefore, fluorine that collects at the cap films between the FSG films is substantially halved and, because of this sparseness of fluorine, an increase of inter-layer capacity can be suppressed. Moreover, because the interposed cap films are not removed by a CMP process, characteristic irregularities are smaller.

Furthermore, when a plurality of the cap films are interposed at the FSG film, as shown in FIG. 9, local concentration and sparseness of the free fluorine can be further suppressed. Furthermore, because the cap films are made thinner, the magnitude of steps at a through-hole (TH) at boundary surfaces between the FSG films and the cap films after etching can be made smaller.

Accordingly, in the sixth embodiment, the fluorine-containing silicon oxide films and the cap films are formed alternately, formation of the FSG film is carried out in stages in the direction of thickness, and a single FSG film whose total FSG film thickness is a desired thickness is eventually formed with the cap films interposed. Therefore, a semiconductor device with stabilized multi-layer wiring structure, including FSG films at which the release of fluorine is suppressed and being free of layer peeling, can be constituted.

In a semiconductor device manufacturing method of the present invention, as described above, a fluorine-containing silicon oxide film (FSG film) can be formed with the release of fluorine being suppressed. Therefore, the FSG film that is obtained is a film with an extremely high concentration of fluorine. Usually, FSG films with high fluorine concentrations tend to have low dielctric constant. Therefore, such films are extremely effective as inter-layer insulation films, and provide semiconductor devices with stable performance.

It should be noted that the semiconductor device manufacturing method of the present invention is not to be interpreted as being limited by any of the embodiments described above. The present invention refers to any implementation within ranges satisfying the conditions of the present invention.

As explained above, according to the present invention, a method of manufacturing by a plasma CVD process a stable semiconductor device, including a fluorine-containing silicon oxide film (FSG film) in which film fluorine release is suppressed and being free of layer peeling, can be provided.

What is claimed is:

1. A method for manufacturing a semiconductor device, the method comprising:
   disposing a substrate in a chamber;
   forming a silicon oxide film that includes fluorine on the substrate from a raw material gas that includes $SiF_4$ using a plasma CVD process; and
   suppressing the amounts of $SiF_2$· and $SiF_3$· taken into the fluorine-including silicon oxide film as compared to the amount of SiF· taken into the fluorine-including silicon oxide film, for suppressing release of fluorine from the silicon oxide film, wherein SiF·, $SiF_2$· and $SiF_3$· are partially decomposed components of the raw material gas.

2. The method for manufacturing a semiconductor device of claim 1, wherein pressure during said forming the fluorine-including silicon oxide film is lower than a pressure at which $SiF_2$· and $SiF_3$· would be generated by plasma.

3. A method for manufacturing a semiconductor device, the method comprising:
   disposing a substrate in a chamber;
   forming a silicon oxide film that includes fluorine on the substrate from a raw material gas that includes $SiF_4$ using a plasma CVD process; and
   suppressing $SiF_2$· and $SiF_3$·, which are partially decomposed components of the raw material gas, from being taken into the fluorine-including silicon oxide film, for suppressing release of fluorine from the silicon oxide film,
   wherein, when formation of a single layer of the fluorine-including silicon oxide film is intended, said forming the fluorine-including silicon oxide film comprises
      laminating a plurality of thin layers for ultimately obtaining the single layer; and
      after completing formation of each one of the thin layers and before commencing formation of a next one of the thin layers, temporarily halting film formation and discharging $SiF_2$· and $SiF_3$· that are generated by plasma from inside the chamber.

* * * * *